(12) United States Patent
McIntyre

(10) Patent No.: US 6,181,195 B1
(45) Date of Patent: Jan. 30, 2001

(54) IMPEDANCE TRANSPORT CIRCUIT

(75) Inventor: Harry J. McIntyre, Los Angeles, CA (US)

(73) Assignee: Xerox Corporation, Stamford, CT (US)

( * ) Notice: Under 35 U.S.C. 154(b), the term of this patent shall be extended for 0 days.

(21) Appl. No.: 09/219,755

(22) Filed: Dec. 23, 1998

(51) Int. Cl.$^7$ ............................................ G05F 1/10
(52) U.S. Cl. ........................ 327/538; 327/543; 323/316
(58) Field of Search ................................. 327/538, 541, 327/543, 540; 323/316; 330/288

(56) References Cited

U.S. PATENT DOCUMENTS

| | | | |
|---|---|---|---|
| Re. 30,586 | * 4/1981 | Brokaw | 323/314 |
| 4,399,399 | * 8/1983 | Joseph | 323/315 |
| 5,212,458 | * 5/1993 | Fitzpatrick et al. | 330/288 |
| 5,285,148 | * 2/1994 | Uhlenhoff et al. | 323/272 |
| 5,666,046 | * 9/1997 | Mietus | 323/313 |
| 5,694,033 | * 12/1997 | Wei et al. | 323/315 |
| 5,821,768 | * 10/1998 | Rau | 326/31 |

* cited by examiner

Primary Examiner—Timothy P. Callahan
Assistant Examiner—Hai L. Nguyen
(74) Attorney, Agent, or Firm—Robert Cunha

(57) ABSTRACT

An impedance transport circuit, which is capable of transporting both AC and DC impedance, utilizes two PMOS transistors and two n-channel transistors with two operational amplifiers. The two operational amplifies cause the drain voltages of all transistors to be equal and therefore transport both the AC and DC input impedance to the output impedance.

12 Claims, 2 Drawing Sheets

IMPEDANCE TRANSPORT CIRCUIT

BACKGROUND OF THE INVENTION

This application is related to an impedance transport circuit and more particularly to a circuit which is capable of transporting both AC and DC impedance.

Many electronic circuits require a high input or output impedance. However, circuits with high magnitude currents require large transistors to create high input or output impedance. Typically, large transistors are not desired. Hence, a trade off is left between high current capability and high output impedance.

It is an object of this invention to provide a circuit which can transport a desired impedance to a high current circuit by utilizing small transistors.

It is yet another object of this invention to provide a circuit which transports both input AC and DC impedance to the output.

SUMMARY OF THE INVENTION

In accordance with the present invention, there is disclosed an impedance transport circuit which is capable of transporting an AC input impedance to an output impedance and invert its polarity. This impedance transport circuit utilizes two MOS transistors and an Op-Amp which causes the drain voltages of the transistors to be equal.

In accordance with another aspect of the present invention, there is disclosed an impedance transport circuit which is capable of transporting both AC and DC input impedance to an output impedance. This impedance transport circuit utilizes four MOS transistors and two Op-Amps which cause the drain voltages of all transistors to be equal.

DESCRIPTION OF THE PREFERRED EMBODIMENT

Figure 1:
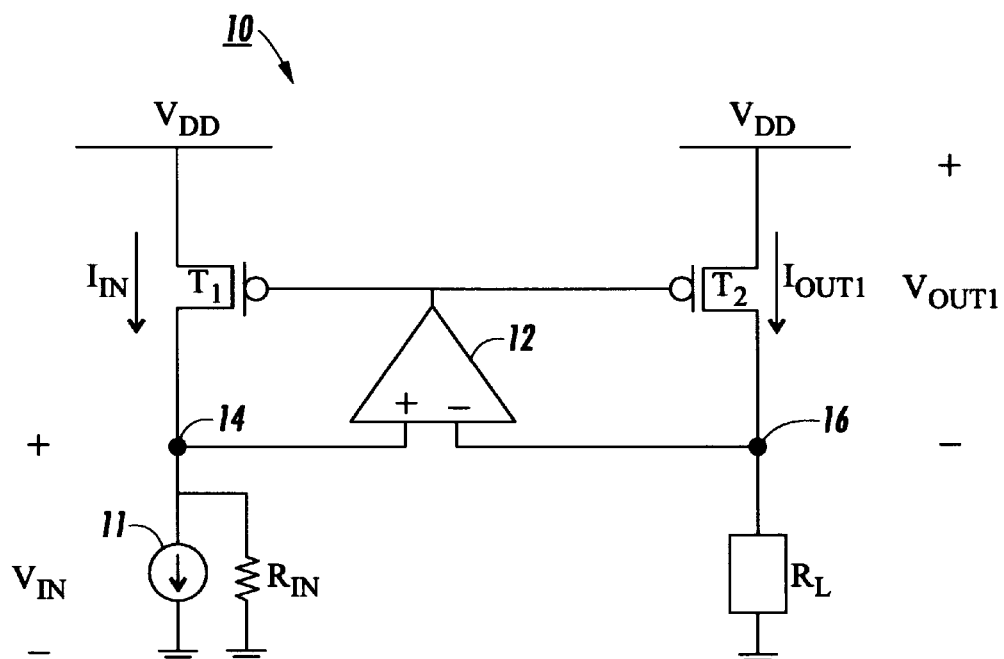
FIG. 1 shows the first step in developing the impedance transport circuit of this invention.

Referring to FIG. 1, there is shown a circuit 10 of an impedance transport of this invention. Circuit 10 comprises an operational amplifier Op-amp 12, two same size p-channel metal oxide silicon field effect transistors (PMOS) $T_1$ and $T_2$. The sources of both transistors $T_1$ and $T_2$ are connected to $V_{DD}$.

The output of the Op-amp 12 is connected to the gate of both transistors $T_1$ and $T_2$. The positive (+) input of the Op-amp 12 is connected to the drain of the transistor $T_1$ at node 14 and the negative (−) input of the Op-amp 12 is connected to the drain of the transistor $T_2$ at node 16. Drain of the transistor $T_1$ is grounded through impedance $R_{IN}$ which represents the impedance of input current source 11 and drain of the transistor $T_2$ is grounded through a load impedance $R_L$.

In operation, the output voltage of the Op-amp 12 forces the voltage of the gates of both transistors $T_1$ and $T_2$ to a voltage where both positive and negative input voltages of the Op-amp 12 become equal. When both positive and negative voltages of the Op-amp are equal then the voltages of nodes 14 and 16 are also equal. As a result, since transistors $T_1$ and $T_2$ have equal sizes, equal source voltages, equal gate voltages and equal drain voltages, any voltage or current change across or through the transistor $T_1$ is replicated in transistor $T_2$.

The voltage of node 16 can change due to a change at the load impedance. Any change in the voltage of node 16 causes the Op-amp 12 to adjust its output and therefore change the voltage of node 14 to be equal to the voltage of node 16. For the purpose of simplicity hereinafter, when it is referred to "a change in the voltage of node 16" it should be understood that "the voltage of node 14 also changes to become equal to the voltage of node 16".

The voltage from $V_{DD}$ to ground is a fixed voltage which leads to:

$(V_{SD1}=V_{SD2})+V_{IN}=V_{DD}$.

Therefore, if the voltage of node 16 changes, then the input voltage $V_{IN}$ and the voltage $V_{DS1}$ across the transistor $T_1$ and the voltage $VDS_2$ across transistor $T_2$ have to compensate for the change. When the voltages of nodes 16 and 14 change, if $V_{IN}$ increases, $V_{SD1}=V_{SD2}$ decreases by the same amount or if $V_{IN}$ decreases, $V_{DS1}=V_{DS2}$ increases by the same amount.

For example, if $V_{IN}$ is 3 volts (voltage at nodes 16 and 14) and if $V_{DD}$ is 5 volts then, $V_{IN}+V_{SD2}=3+V_{SD2}=5$ volts $V_{SD2}=V_{SD1}=2$ volts.

If the voltage at nodes 16 and 14 change to 3.5 volts then, $V_{IN}+V_{SD2}=3.5+V_{SD2}=5$ volts $V_{SD2}=V_{SD1}=1.5$ volts.

The above voltage changes affect AC impedance and DC impedance differently. However, prior to studying the AC and DC impedance, it should be noted that to measure impedance, an industry convention needs to be followed. The industry convention considers a current positive when the current flows from a node that the impedance is observed into an element with impedance. Also, the industry convention considers a voltage positive when the higher potential of the voltage across the element with the impedance is located at the node from which the impedance is observed.

Figure 2:
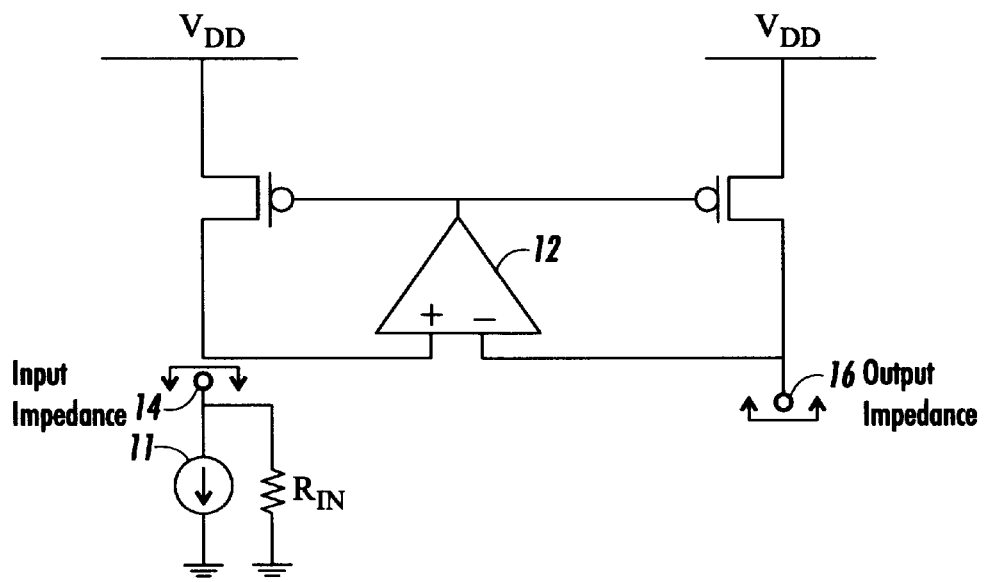
FIG. 2 shows a representation of input impedance and output impedance.

Referring to FIG. 2, there is shown a representation of input impedance and output impedance. Again based on the industry convention, the input impedance $R_{IN}$ is the impedance which can be observed from node 14 looking into the current source 11 and the output impedance $R_{OUT}$ is the impedance which can be observed from node 16 looking into the circuit 10.

Referring back to FIG. 1, for the input impedance, the current $I_{IN}$ is positive since it flows from the transistor $T_1$ and node 14 into the resistor $R_{IN}$. The voltage $V_{IN}$ is also positive since the higher potential is at node 14. However for the output impedance, the current $I_{OUT}$ is negative since it flows from transistor $T_1$ into node 16. The voltage $V_{OUT}$ is also negative since the higher potential is at $V_{DD}$ as opposed to node 16.

The above conventions allow the AC and DC input impedance to be compared to the AC and DC output impedance. An AC impedance is an impedance that occurs during the time the voltage and current are changing from one level to another. Therefore, when the voltage of node 16 changes, it causes the current $I_{IN}$ and the voltage $V_{IN}$ at the input and the current $I_{OUT}$ and the voltage $V_{OUT}$ at the output to change. During this change, an AC input impedance $R_{ACI}$ is generated at the input and an AC output impedance $R_{ACO}$ is generated at the output.

An AC impedance $R_{AC}$ is equal to:

$$R_{AC} = \frac{\text{Change in voltage}}{\text{Change in current}} = \frac{\Delta V}{\Delta I} \quad (1)$$

Therefore, the AC input impedance $R_{ACI}$ is equal to:

$$R_{ACI} = \frac{\text{Change in input voltage}}{\text{Change in input current}} = \frac{V_{IN2} - V_{IN1}}{\frac{V_{IN2}}{R_{IN}} - \frac{V_{IN1}}{R_{IN}}} \quad (2)$$

As the input voltage $V_{IN}$ changes from $V_{IN1}$ to $V_{IN2}$ the current passing through transistor $T_1$ and the resistor $R_{IN}$ changes. Since the changes in transistor $T_1$ is replicated in transistor $T_2$, the current change in transistor $T_2$ is equal to the current change in transistor $T_2$. Therefore, the current change for the AC output impedance is equal to the current change for the AC input impedance except with an opposite sign due to the convention. As a result, the AC output impedance $R_{ACO}$ is equal to:

$$R_{ACO} = \frac{\text{Change in output voltage}}{\text{Change in output current}} = \frac{\text{Change in output voltage}}{-\left[\frac{V_{IN2}}{R_{IN}} - \frac{V_{IN1}}{R_{IN}}\right]} \quad (3)$$

Since
$$V_{OUT1} = V_{DD} - V_{IN1}$$
and
$$V_{OUT2} = V_{DD} - V_{IN2}$$
and since due to the convention the sign of $V_{OUT1}$ and $V_{OUT2}$ have to be changed, the:

change in the output voltage equals = $[-V_{OUT2}] - [-V_{OUT1}] =$ $$= [-(V_{DD} - V_{IN2})] - [-(V_{DD} - V_{IN1})]$$

$$= V_{IN2} - V_{IN1}$$

Therefore, $$R_{ACO} = \frac{\text{Change in output voltage}}{\text{Change in output current}} = \frac{V_{IN2} - V_{IN1}}{-\left[\frac{V_{IN2}}{R_{IN}} - \frac{V_{IN1}}{R_{IN}}\right]} = -R_{ACI} \quad (4)$$

Equations 3 and 4 show that the AC input impedance has the same magnitude as the AC output impedance except with reverse polarity. This shows that circuit 10 transports the AC input impedance to the output impedance, but changes the polarity.

Circuit 20 only transports the AC impedance with a reverse polarity but, does not transport the DC impedance. A DC impedance $R_{DC}$ is equal to:

$$RDC = \frac{\text{Voltage across the element with impedance}}{\text{Current through the element with impedance}}$$

The main difference between the DC and the AC impedance is that the DC impedance needs the actual voltage and the actual current as opposed to the AC impedance which requires the change in voltage and the change in current.

In Circuit 10, the currents through transistors $T_1$ and $T_2$ are equal. Therefore, for the DC input and output impedance we have the same current with different polarities because of the convention. However, the input voltage across $R_{IN}$ is $V_{IN}$, but the output voltage across transistor $T_2$ is $V_{DD} - V_{IN}$. Therefore, $R_{DCI}$ is equal to:

$$RDCI = \frac{VIN}{\frac{VIN}{RIN}}$$

and DC output impedance is equal to:

$$R_{DCO} = \frac{-(V_{DD} - V_{IN})}{-\left(\frac{V_{IN}}{R_{IN}}\right)} = \frac{(V_{IN} - V_{DD})}{-\left(\frac{V_{IN}}{R_{IN}}\right)} = -\frac{V_{IN}}{\left(\frac{V_{IN}}{R_{IN}}\right)} + \frac{V_{DD}}{\left(\frac{V_{IN}}{R_{IN}}\right)} = -R_{IN} + \frac{V_{DD}}{\left(\frac{V_{IN}}{R_{IN}}\right)}$$

So, the output DC impedance not only has a reverse polarity, but also is translated to a different value.

Figure 3:
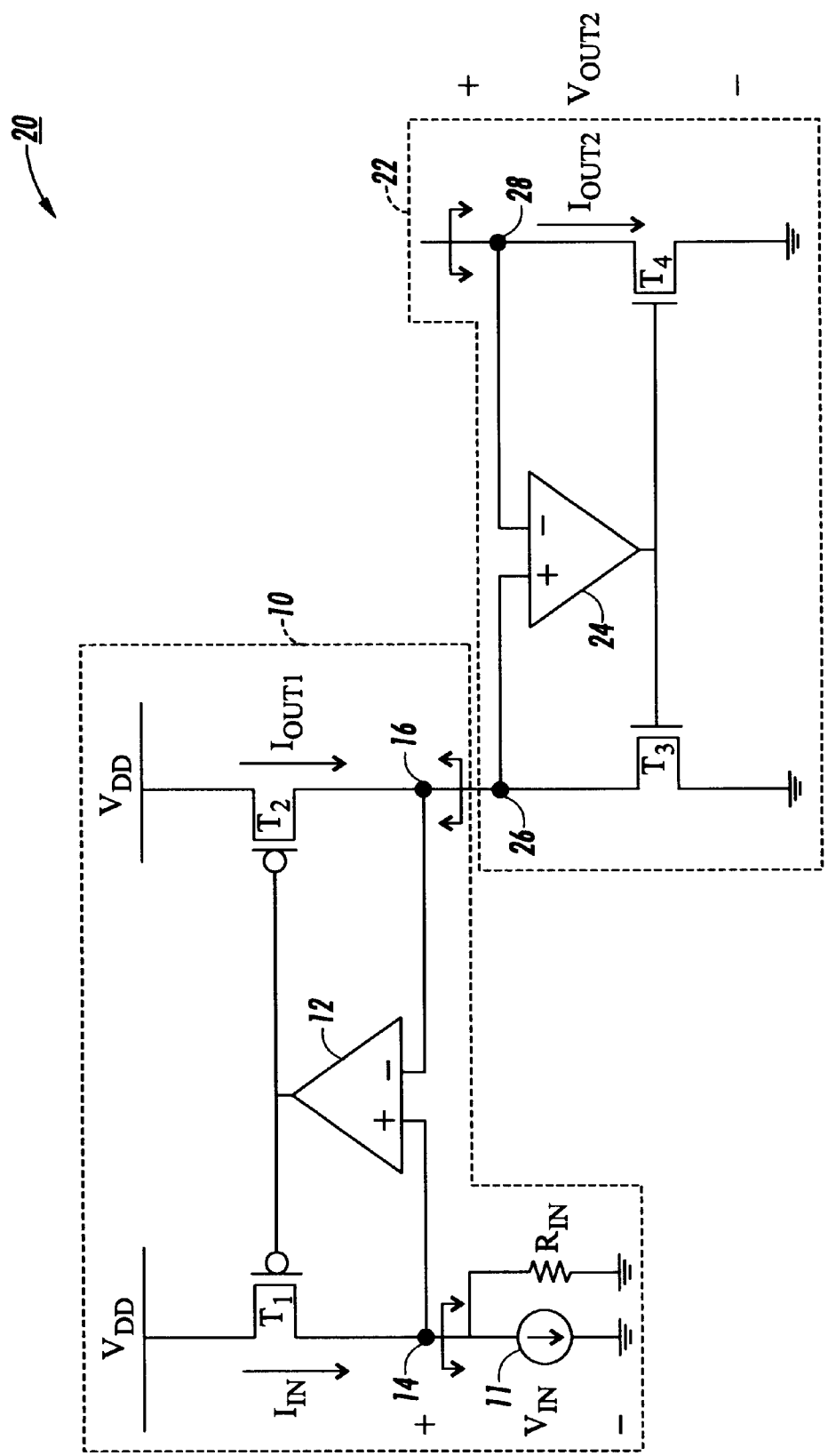
FIG. 3 shows the preferred embodiment of the impedance transport circuit of this invention.

In order to transport both the DC and the AC input impedance to the output impedance without polarity change or translation, one more stage is required. Referring to FIG. 3, there is shown a circuit 20 of this invention which is capable of transporting both AC and DC impedance. Circuit 20, comprises circuit 10 of FIG. 1 and a second circuit 22. In FIG. 2, all the elements of circuit 10 of FIG. 1 are designated by the same reference numerals.

Circuit 22 comprises an Op-Amp 24 and two p-channel MOS transistors $T_3$ and $T_4$. The drain of transistor $T_3$ is connected to the drain of the transistor $T_2$. The sources of both transistors $T_3$ and $T_4$ are grounded. The output of the Op-Amp 24 is connected to the gates of both transistors $T_3$ and $T_4$. The positive input of the Op-Amp 24 is connected to the drain of the transistor $T_3$ at node 26 which is the same as node 16 and the negative input of the Op-amp 24 is connected to the drain of the transistor $T_4$ at node 28.

In operation, the output voltage of the Op-amp 24 forces the voltage of the gates of both transistors $T_3$ and $T_4$ to a voltage where both positive and negative input voltages of the Op-amp 24 become equal. When both positive and negative voltages of the Op-amp are equal then the voltages of nodes 26 and 28 are also equal.

The Op-amps 12 and 24 have to balance the circuit 20. The output of Op-amp 12 causes the voltages of the nodes 14 and 16 to be equal and the output of Op-amp 24 causes the voltages of nodes 26 and 28 to be equal. Since nodes 26 and 16 are directly connected to each other and have the same voltage, nodes 14, 16, 26, and 28 must have equal voltages. Therefore, Op-amps 12 and 24 work, in cooperation with each other, to provide the same voltage at nodes 14, 16, 26, and 28.

In circuit 20, the output impedance $R_{OUT2}$ is the impedance which can be observed from node 28 looking into the circuit 20. Since the voltage of nodes 14, 16, 26, and 28 are equal, the input voltage $V_{IN}$ is equal to the output voltage $V_{OUT2}$. Also, the input current $I_{IN}$ through the input impedance $R_{IN}$ has the same direction as the output current $I_{OUT2}$ through the transistor $T_4$. Therefore, if the voltage of node 28 changes, the voltage of node 16 changes by the same magnitude and same polarity.

As a result, the output voltage $V_{OUT2}$ and the output current $I_{OUT2}$ have the same magnitude and polarity as the input voltage $V_{IN}$ and the input current $I_{IN}$ respectively. Therefore, circuit 20 transports both AC and DC input impedance to the output.

Transistors $T_1$, $T_2$, $T_3$, and $T_4$ are small transistors which can handle a current in the range of 1–20 $\mu$A. Circuit 20 can replace the large output transistor of a high current circuit. Circuit 20 can replace large transistors which can handle a current in the range of 100 $\mu$A to 30 mA. Circuit 20 including its four transistors and two Op-amps is substantially smaller than one large transistor which can handle a current in the range of 100 µA to 30 mA.

In circuit 20, the two transistors $T_1$ and $T_2$ are p-channel transistors and the two transistors $T_3$ and $T_4$ are n-channel transistors. However, this can be reversed. The two transistors $T_1$ and $T_2$ can be selected to be n-channel transistors which requires that the two transistors $T_3$ and $T_4$ to be p-channel transistors.

Circuit 10, which transports only the AC impedance and changes its polarity, is also useful in certain applications such as canceling the effect of an AC impedance in a circuit.

The disclosed embodiments of this invention can be designed to scale the output impedance. By selecting different size transistors, the output impedance can be set to a desired value. The ratio of the size of the output transistor to the size of the input transistor determines the ratio between the input and output impedance. If the size of the output transistor is larger or smaller than the size of the input transistor then, the output impedance will be smaller or larger respectively.

It should be noted that numerous changes in details of construction and the combination and arrangement of elements may be resorted to without departing from the true spirit and scope of the invention as hereinafter claimed.

What is claimed is:

1. An impedance transport circuit comprising:
   a first metal oxide silicon field effect transistor having a first drain voltage;
   a second metal oxide silicon field effect transistor having a second drain voltage;
   a first balancing circuit being electrically connected to said first transistor and said second transistor;
   said first and said second transistors being responsive to said first balancing circuit for causing said first and said second drain voltages to be equal;
   a third metal oxide silicon field effect transistor having a third drain voltage:
   a fourth metal oxide silicon field effect transistor having a fourth drain voltage;
   a second balancing circuit being electrically connected to said third transistor and said fourth transistor;
   said second transistor being electrically connected to said third transistor; and
   said first and said second transistors being responsive to said first balancing circuit and said third and said for transistors being responsive to said second balancing circuit for causing said first, said second, said third, and said fourth drain voltages to be equal.

2. The impedance transport circuit recited in claim 1, wherein said first balancing means is an Op-amp.

3. The impedence transport circuit recited in claim 1 wherein said first balancing circuit and said second balancing circuit are Op-amps.

4. The impedance transport circuit recited in claim 1, wherein said first and said second metal oxide silicon field effect transistors are p-channel transistors.

5. The impedance transport circuit recited in claim 1, wherein said first and said second metal oxide silicon field effect transistors are p-channel transistors and said third and fourth metal oxide silicon field effect transistors are n-channel transistors.

6. The impedance transport circuit recited in claim 1, wherein said first and said second metal oxide silicon field effect transistors are n-channel transistors.

7. The impedance transport circuit recited in claim 1, wherein said first and said second metal oxide silicon field effect transistors are n-channel transistors and said third and fourth metal oxide silicon field effect transistors are p-channel transistors.

8. An impedance transport circuit comprising:
   a first metal oxide silicon field effect transistor having a gate, a drain and a source;
   a second metal oxide silicon field effect transistor having a gate, a drain and a source;
   a first operational amplifier having a first input, a second input, and an output;
   said output of said first operational amplifier being electrically connected to said gate of said first transistor and said gate of said second transistor;
   said first input of said first operational amplifier being electrically connected to said drain of said first transistor;
   said second input of said first operational amplifier being electrically connected to said drain of said second transistors;
   said source of said first and said second transistors being electrically connected to a power supply;
   said drain of said first transistor being grounded through a current source;
   said drain of said second transistor being connected to a load impedance
   a third metal oxide silicon field effect transistor having a gate, a drain and a source;
   a fourth metal oxide silicon field effect transistor having a gate, a drain and a source;
   a second operational amplifier having a first input, a second input and an output;
   said output of said second operational amplifier being electrically connected to said gate of said third transistor and said gate of said fourth transistor;
   said first input of said second operational amplifier being electrically connected to said drain of said third transistor;
   said second input of said second operational amplifier being electrically connected to said drain of said fourth transistor;
   said source of said third and said fourth transistors being electrically connected to said power supply;
   said drain of said first transistor being grounded through a current source;
   said drain of said second transistor being electrically connected to said drain of said third transistor as a load impedance; and
   said drain of said fourth transistor being connected to a load impedance.

9. The impedance transport circuit recited in claim 8, wherein said first and said second metal oxide silicon field effect transistors are p-channel transistors.

10. The impedance transport circuit recited in claim 8, wherein said first and said second metal oxide silicon field effect transistors are p-channel transistors and said third and fourth metal oxide silicon field effect transistors are n-channel transistors.

11. The impedance transport circuit recited in claim 8, wherein said first and said second metal oxide silicon field effect transistors are n-channel transistors.

12. The impedance transport circuit recited in claim 8, wherein said first and said second metal oxide silicon field effect transistors are n-channel transistors and said third and fourth metal oxide silicon field effect transistors are p-channel transistors.

\* \* \* \* \*